(12) United States Patent
Verner et al.

(10) Patent No.: US 9,970,332 B2
(45) Date of Patent: May 15, 2018

(54) SLIDING CAM RECOVERY FROM SHORT TO GROUND ON ACTUATOR LOW SIDE

(71) Applicant: GM Global Technology Operations LLC, Detroit, MI (US)

(72) Inventors: Douglas R. Verner, Sterling Heights, MI (US); Kevin Andrew Gady, Saline, MI (US); Scot A. Douglas, Howell, MI (US); Joseph J. Moon, Beverly Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 419 days.

(21) Appl. No.: 14/921,231

(22) Filed: Oct. 23, 2015

(65) Prior Publication Data

US 2017/0114676 A1    Apr. 27, 2017

(51) Int. Cl.
| | |
|---|---|
| F01L 1/34 | (2006.01) |
| F01L 9/02 | (2006.01) |
| F01L 9/04 | (2006.01) |
| H03K 17/68 | (2006.01) |
| F01L 1/047 | (2006.01) |
| F02D 41/22 | (2006.01) |
| F02D 41/20 | (2006.01) |
| F01L 1/053 | (2006.01) |
| F01L 13/00 | (2006.01) |
| H03K 17/687 | (2006.01) |
| F02D 41/00 | (2006.01) |

(52) U.S. Cl.
CPC ............... *F01L 1/34* (2013.01); *F01L 1/047* (2013.01); *F01L 9/02* (2013.01); *F01L 9/026* (2013.01); *F01L 9/04* (2013.01); *F01L 13/0036* (2013.01); *F02D 41/221* (2013.01); *H03K 17/6871* (2013.01); *F01L 1/053* (2013.01); *F01L 2013/0052* (2013.01); *F01L 2013/101* (2013.01); *F01L 2201/00* (2013.01); *F01L 2800/11* (2013.01); *F02D 41/20* (2013.01); *F02D 2041/001* (2013.01); *F02D 2041/2093* (2013.01); *Y02T 10/142* (2013.01); *Y02T 10/40* (2013.01)

(58) Field of Classification Search
CPC ..... F01L 9/02; F01L 9/026; F01L 9/04; F02D 41/20; H03K 17/6871; Y02T 10/142
See application file for complete search history.

(56) References Cited

U.S. PATENT DOCUMENTS

| | | | | |
|---|---|---|---|---|
| 5,469,825 A | * | 11/1995 | Golab | ............... F02D 41/20 123/479 |
| 2004/0103867 A1 | * | 6/2004 | Hayase | ............... F01L 1/267 123/90.11 |
| 2004/0187814 A1 | * | 9/2004 | Fuwa | ............... F01L 9/04 123/90.11 |

(Continued)

*Primary Examiner* — Mark Laurenzi
*Assistant Examiner* — Wesley Harris

(57) ABSTRACT

An engine control module includes at least one high side driver connected to at least one intake camshaft actuator and at least one exhaust camshaft actuator. A plurality of low side drivers is connected to the at least one intake camshaft actuator and the at least one exhaust camshaft actuator. A sliding camshaft control module selectively actuates the at least one high side driver and the plurality of low side drivers based on a status associated with the at least one intake camshaft actuator and/or the at least one exhaust camshaft actuator.

18 Claims, 6 Drawing Sheets

(56) References Cited

U.S. PATENT DOCUMENTS

| | | | |
|---|---|---|---|
| 2006/0070591 A1* | 4/2006 | Merwin | F01L 9/02 123/90.11 |
| 2015/0107540 A1 | 4/2015 | Moon et al. | |

* cited by examiner

SLIDING CAM RECOVERY FROM SHORT TO GROUND ON ACTUATOR LOW SIDE

FIELD

The present disclosure relates to internal combustion engines, and more particularly to systems and methods for controlling sliding camshaft actuators.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Vehicles include an internal combustion engine that generates drive torque. More specifically, an intake valve is selectively opened to draw air into a cylinder of the engine. The air mixes with fuel to form an air/fuel mixture that is combusted within the cylinder. The air/fuel mixture is compressed and combusted to drive a piston within the cylinder. An exhaust valve selectively opens to allow the exhaust gas resulting from combustion to exit the cylinder.

Under some circumstances, one or more cylinders of an engine may be deactivated. Deactivation of a cylinder may include deactivating the opening and closing of intake valves of the cylinder and halting fueling of the cylinder. One or more cylinders may be deactivated, for example, to decrease fuel consumption when the engine can produce a requested amount of torque while the one or more cylinders are deactivated.

A rotating camshaft regulates the opening and closing of the intake and/or exhaust valves. The camshaft includes cam lobes that are fixed to and rotate with the camshaft. The geometric profile of a cam lobe generally controls the period that the valve is open (duration) and the magnitude or degree to which the valve opens (lift). The vehicle may switch between various lift states (e.g., high, low, and deactivation) with the implementation of a sliding camshaft to maximize engine performance while maintaining optimal fuel efficiency. Actuators, such as solenoids, may be utilized to command the sliding operation of the camshaft.

SUMMARY

An engine control module includes at least one high side driver connected to at least one intake camshaft actuator and at least one exhaust camshaft actuator. A plurality of low side drivers is connected to the at least one intake camshaft actuator and the at least one exhaust camshaft actuator. A sliding camshaft control module selectively actuates the at least one high side driver and the plurality of low side drivers based on a status associated with the at least one intake camshaft actuator and/or the at least one exhaust camshaft actuator.

A method includes providing at least one high side driver coupled to at least one intake camshaft actuator and at least one exhaust camshaft actuator and providing a plurality of low side drivers coupled to the at least one intake camshaft actuator and the at least one exhaust camshaft actuator. The method further includes selectively actuating the at least one high side driver and/or the plurality of low side drivers based on a status associated with the at least one intake camshaft actuator and/or the at least one exhaust camshaft actuator.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A sliding cam control module (SCCM) controls a sliding operation of a camshaft to allow an engine to alternate between various cam lobe profiles (e.g., high, low, and deactivation). The cam lobe profiles are used to adjust a lift profile of an intake and an exhaust valve to maximize engine performance while improving fuel economy. This can be done by utilizing a sliding camshaft, which allows the camshaft to slide in a longitudinal direction while rotating about a camshaft axis. The sliding operation may be controlled using actuators, such as solenoids. The actuator includes at least one groove pin that can move between a retracted position and an extended positon.

Operation of the actuator, and more particularly the groove pin, is controlled by the SCCM. The SCCM may actuate the groove pin between a retracted position and an extended position. The engine control module (ECM) according to the principles of the present disclosure includes at least one high side driver coupled to the actuators, a plurality of low side drivers coupled to the actuators, and the SCCM to selectively activate the high side driver and the low side drivers. When the groove pin is in the extended position, the camshaft slides towards a desired cam lift state. The SCCM may then command the actuator to maintain the groove pin in the retracted position until a desired transition is requested.

In one embodiment, a short to ground fault condition may occur when a camshaft actuator shorts to ground. The short to ground fault may cause the groove pin to remain in the extended position or it may cause the groove pin to move between the retracted position and the extended position, causing an undesired cam lift state, which may lead to lower engine power and/or a hard start of the engine. The ECM may then detect the short to ground fault and send a fault signal to the SCCM. The SCCM may utilize at least one high side driver to control the camshaft actuator to a desired cam lift state (e.g., higher cam lift) in the event of a short to ground fault, which allows the groove pin between the extended position and the retracted position.

Figure 1:
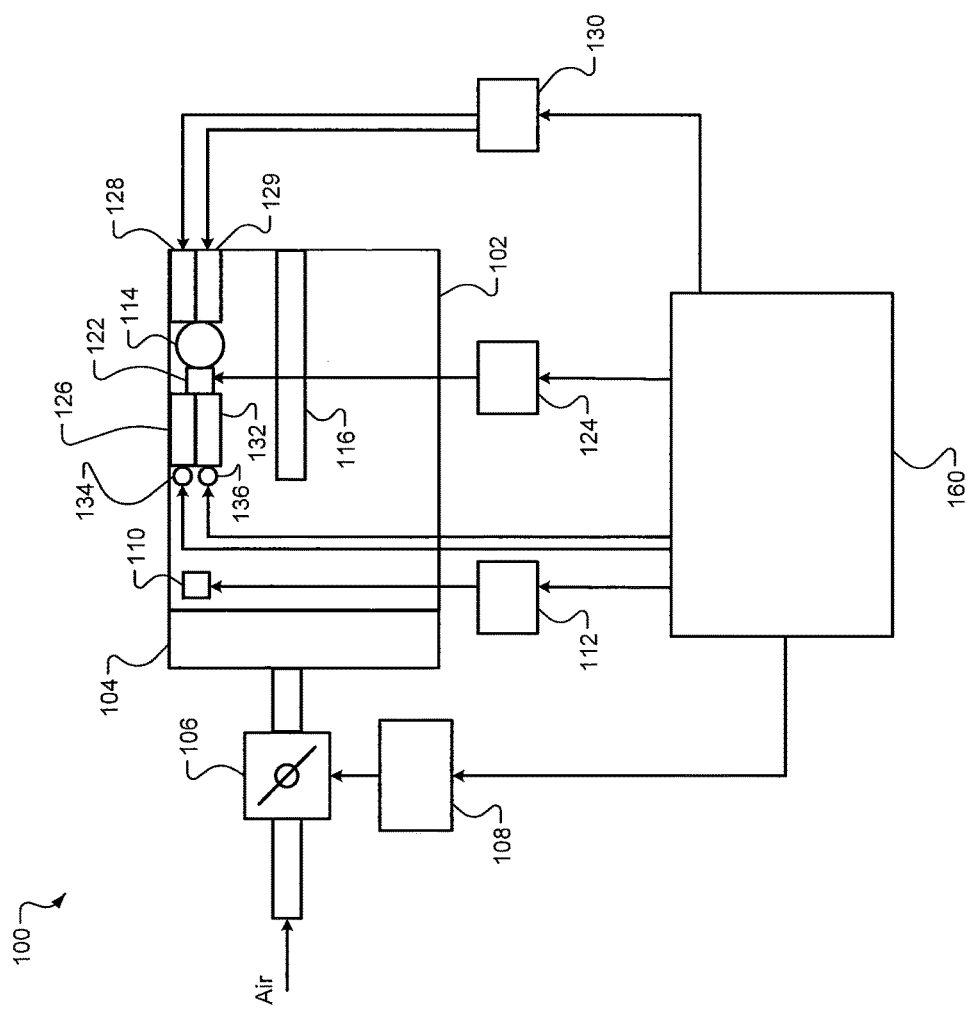
FIG. 1 is a functional block diagram of an example engine control system according to the present disclosure.

Referring now to FIG. 1, a functional block diagram of an example engine control system 100 is presented. An engine 102 generates drive torque for a vehicle. Air is drawn into the engine 102 through an intake manifold 104. Airflow into the intake manifold 104 may be varied by a throttle valve 106. A throttle actuator module 108 (e.g., an electronic throttle controller) controls opening of the throttle valve 106. One or more fuel injectors, such as fuel injector 110, mix fuel with the air to form a combustible air/fuel mixture. A fuel actuator module 112 controls the fuel injector(s). A cylinder 114 includes a piston (not shown) that is coupled to a crankshaft 116. Although the engine 102 is depicted as including only the cylinder 114 (FIG. 1), the engine 102 may include more than one cylinders (FIG. 2A).

Figure 2A:
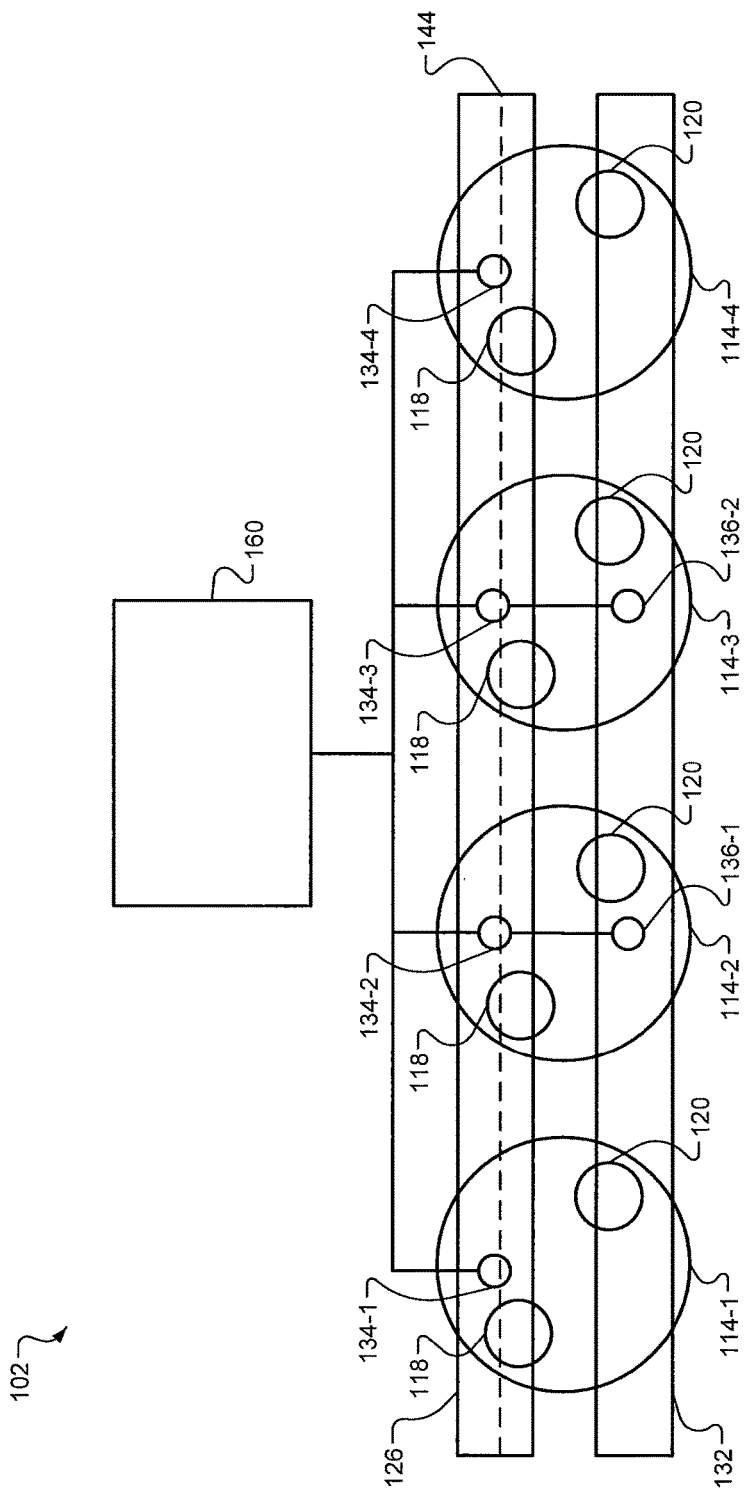
FIG. 2A is a diagram of a vehicle engine assembly according to the present disclosure.

FIG. 2A is a diagram of a vehicle engine assembly. The engine 102 defines a plurality of cylinders 114-1, 114-2, 114-3, and 114-4 (e.g., a first cylinder 114-1, a second cylinder 114-2, a third cylinder 114-3, and a fourth cylinder 114-4). Although FIG. 2A illustrates four cylinders, the engine 102 may include more or fewer cylinders. The timing of opening and closing of an intake valve 118 is regulated by an intake camshaft 126. One or more intake valves, such as intake valve 118, may be associated with the cylinder 114. An intake camshaft, such as the intake camshaft 126, may be provided for each bank of cylinders of the engine 102. The timing of opening and closing of an exhaust valve 120 is regulated by an exhaust camshaft 132. One or more exhaust valves, such as exhaust valve 120, may be associated with the cylinder 114. An exhaust camshaft, such as the exhaust camshaft 132, may be provided for each bank of cylinders of the engine 102. For purposes of discussion, only the intake valve 118 and the exhaust valve 120 will be discussed. Rotation of the intake camshaft(s) 126 and the exhaust camshaft(s) 132 is generally driven by rotation of the crankshaft 116, such as by a belt or a chain.

The trapped combustible air/fuel mixture inside the cylinder 114 is ignited by a spark plug 122. A spark actuator module 124 controls the spark plug 122. A cam phaser regulates rotation of an associated camshaft. An intake cam phaser 128 regulates rotation of the intake camshaft 126. An exhaust cam phaser 129 regulates rotation of the exhaust camshaft 132. A valve actuator module 130 controls the intake cam phaser 128. The valve actuator module 130 or another valve actuator module may control the exhaust cam phaser 129.

Figure 2B:
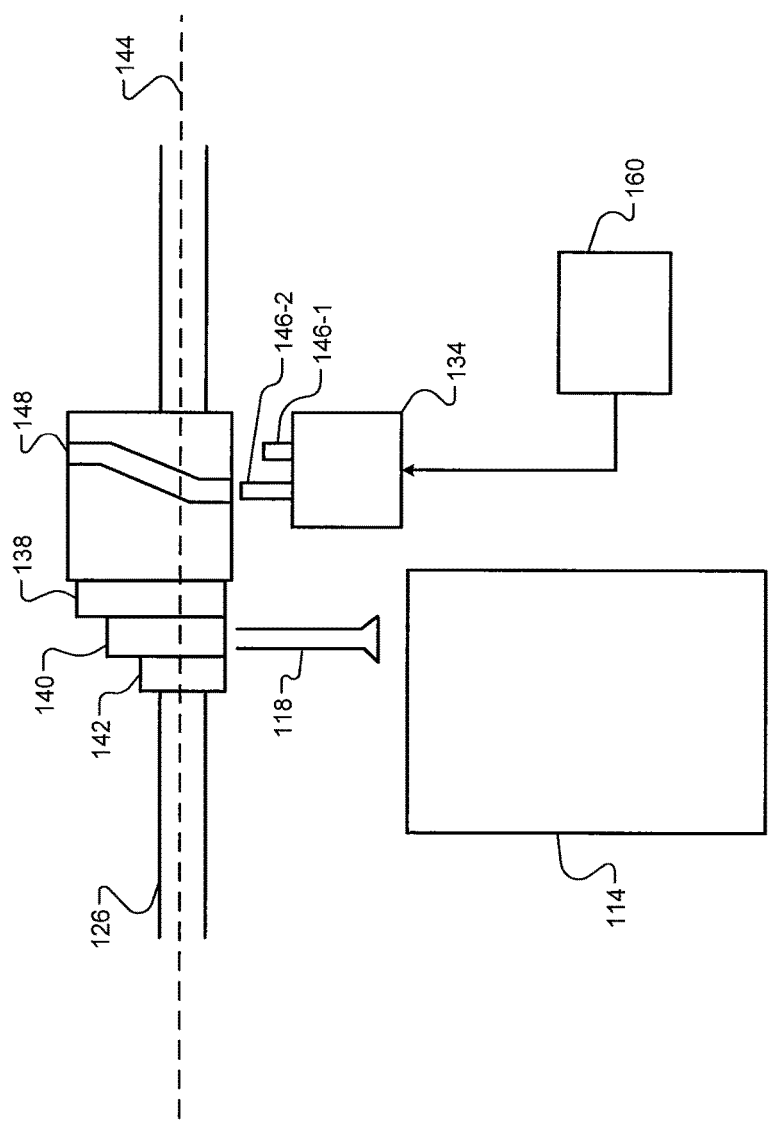
FIG. 2B is an example of a portion of a sliding intake camshaft operation according to the present disclosure.

FIG. 2B is an example of a portion of a sliding intake camshaft operation. With reference to FIGS. 2A and 2B, the intake camshaft 126 rotates about a camshaft axis 144. The intake camshaft 126 includes a plurality of cam lobes including high lift cam lobes, such as high lobe 138, and low lift cam lobes, such as low lobe 140. For example only, the intake camshaft 126 may include one low lift cam lobe 140 and one high lift cam lobe 138 for each intake valve 118 of a cylinder 114. The intake camshaft 126 may also include one additional cam lobe for each intake valve 118 of a cylinder 114 for operation in a cylinder deactivation mode, such as deactivation lobe 142. The intake valves 118 and exhaust valves 120 of one or more cylinders 114-1, 114-2, 114-3, and 114-4, such as half of the cylinders 114-2 and 114-3 of the engine 102, are deactivated during operation in the cylinder deactivation mode.

While FIG. 2B shows the operation of the sliding intake camshaft 126, a similar operation is performed on the exhaust camshaft 132. The exhaust camshaft 132 rotates about a camshaft axis (not shown). The exhaust camshaft 132 includes a plurality of cam lobes including high lift cam lobes, such as high lobe 138, and deactivation cam lobes, such as deactivation lobe 142. For example only, the exhaust camshaft 132 may include one high cam lobe 138 and one deactivation cam lobe 142 for each exhaust valve 120 of a cylinder 114. The deactivation cam lobe 142 profile may be circular (e.g., zero lift) in order to deactivate the opening and closing of intake valves 118 and/or exhaust valves 120.

To adjust between various cam lift lobes (e.g., high, low, or deactivation), a sliding camshaft may be utilized. The intake camshaft 126 may slide longitudinally along camshaft axis 144 to provide various lift states (e.g., high, low, or deactivation), controlled by a plurality of intake actuators 134-1, 134-2, 134-3, and 134-4, referred to collectively as intake actuator 134. Similarly, the exhaust camshaft 132 may slide longitudinally along a camshaft axis to provide various lift states (e.g., high or deactivation), controlled by a plurality of exhaust actuators 136-1 and 136-2, referred to collectively as exhaust actuator 136.

For example only, the intake camshaft 126 is shown as having four intake actuators 134-1, 134-2, 134-3, and 134-4 (e.g., a first intake actuator 134-1, a second intake actuator 134-2, a third intake actuator 134-3, and a fourth intake actuator 134-4). The first intake actuator 134-1 is operatively associated with the first and second cylinders 114-1, 114-2 and may be actuated to control the operation of the intake valves 118 of cylinders 114-1, 114-2 between the high lobe 138 and the low lobe 140, or between the low lobe 140 and the deactivation lobe 142. The second intake actuator 134-2 is operatively associated with the first and second cylinders 114-1, 114-2 and may be actuated to control the operation of the intake valves 118 of cylinders 114-1, 114-2 between the deactivation lobe 142 and the low lobe 140, or between the low lobe 140 and the high lobe 138. The third intake actuator 134-3 is operatively associated with the third and fourth cylinders 114-3, 114-4 and may be actuated to control the operation of the intake valves 118 of cylinders 114-3, 114-4 between the high lobe 138 and the low lobe 140, or between the low lobe 140 and the deactivation lobe 142. The fourth intake actuator 134-4 is operatively associated with the third and fourth cylinders 114-3, 114-4 and may be actuated to control the operation of the intake valves 118 of cylinders 114-3, 114-4 between the deactivation lobe 142 and the low lobe 140, or between the low lobe 140 and the high lobe 138. Although FIG. 2A illustrates four intake actuators 134, the engine 102 may include more or fewer intake actuators.

For example only, the exhaust camshaft 132 is shown as having two exhaust actuators 136-1 and 136-2 (e.g., a first exhaust actuator 136-1 and a second exhaust actuator 136-2). The first exhaust actuator 136-1 is operatively associated with the second cylinder 114-2 and may be actuated to control the operation of the exhaust valves 120 of cylinder 114-2 between the high lobe 138 and the deactivation lobe 142. The second exhaust actuator 136-2 is operatively associated with the third cylinder 114-3 and may be actuated to control the operation of the exhaust valves 120 of cylinder 114-3 between the deactivation lobe 142 and the high lobe 138. Although FIG. 2A illustrates two exhaust actuators 136, the engine 102 may include more or fewer exhaust actuators.

An SCCM 156 (as described in more detail in FIG. 3) may control the duty cycle, voltage, and/or current of the solenoids to command the intake actuator 134 to move a first groove pin 146-1 or a second groove pin 146-2 between the retracted position and the extended position while the intake camshaft 126 is rotating about the camshaft axis 144. During the rotation of the intake camshaft 126, the extended position groove pin (e.g., the second groove pin 146-2 as shown in FIG. 2B) may ride along a groove channel 148 until the intake camshaft 126 has achieved its move to the desired lift state (e.g., high, low, or deactivation). Since the groove channel 148 has varying depth, the extended groove pin (e.g., 146-2) may be mechanically moved to the retracted position once the desired lift state is achieved. Alternatively, the SCCM 156 may command the intake actuator 134 to move the extended groove pin to the retracted position.

Figure 3:
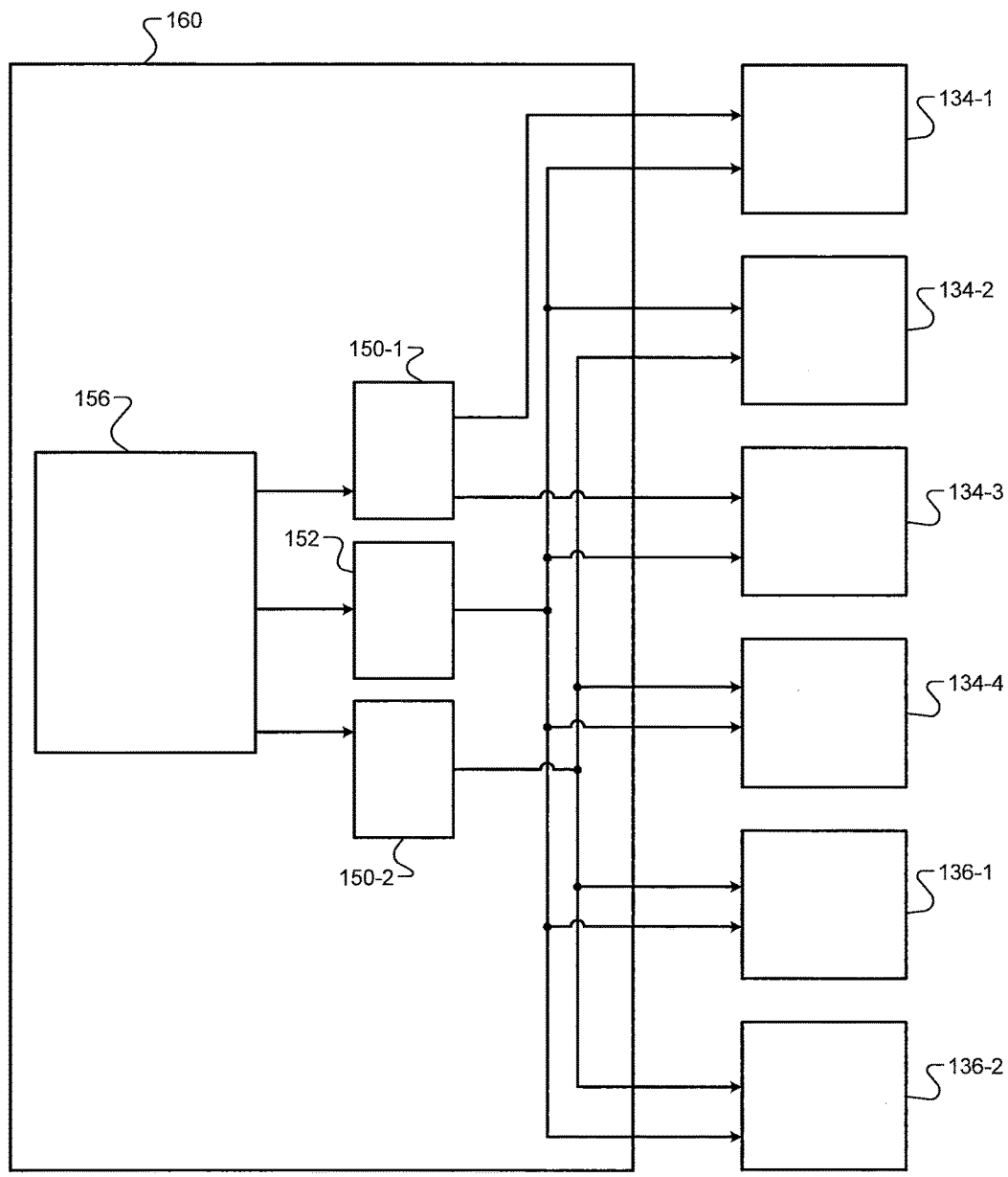
FIG. 3 is a functional block diagram of an example engine control module according to the present disclosure.

FIG. 3 shows a functional block diagram of an example ECM 160. The ECM 160 includes the SCCM 156, at least one high side driver 150, and a plurality of low drivers 152. The SCCM 156 is coupled to a first high side driver 150-1, a second high side driver 150-2, and a plurality of low side drivers 152. The first high side driver 150-1 is coupled to the first intake actuator 134-1 and the third intake actuator 134-3. The second high side driver 150-2 is coupled to the second intake actuator 134-2, the fourth intake actuator 134-4, the first exhaust actuator 136-1, and the second exhaust actuator 136-2. The plurality of low side drivers 152 are coupled to the intake actuators 134 and the exhaust actuators 136. The high side drivers 150-1, 150-2 and the low side drivers 152 may be implemented as switches. For example, the switches may be mechanically operated (e.g., relay) or electronically operated (e.g., transistor or MOSFET).

Power to the high side driver 150 and the low side drivers 152 may be commanded by the SCCM 156. For example only, the high side driver 150 and the low side drivers 152 may be implemented as switches to selectively control the operation of the intake actuators 134 and the exhaust actuators 136, and more particularly the operation of the groove pin 146-1, 146-2 associated with the respective actuators. When a short to ground fault condition is present on any one of the intake camshaft actuators 134 or the exhaust camshaft actuators 136, the respective low side drivers 152-1, 152-2, . . . , and 152-12 may power on, commanding the groove pin 146-1, 146-2 to remain in the extended position or commanding the groove pin between the retracted positon and the extended position. This may lead the intake camshaft 126 or exhaust camshaft 132 into an undesired lift state. The extended groove pin may be mechanically moved to the retracted position once an undesired lift state is achieved; however, it may be repeatedly commanded to the extended position because of the present short to ground fault on the respective camshaft actuator. If the short to ground fault occurs on any one of the exhaust actuators 136, the cylinders 114 may misfire. If the short to ground fault is present on any one of the intake actuators 134, the intake actuator 134 may fail as a result of an overheating condition.

The ECM 160 may then detect the short to ground fault and send a fault signal to the SCCM 156. Accordingly, the SCCM 156 may command the respective high side driver 150 to maintain power until a desirable life state is achieved. The SCCM 156 may then terminate power to the high side driver 150 and the low side drivers 152 until the short to ground fault condition is repaired.

Figure 4:
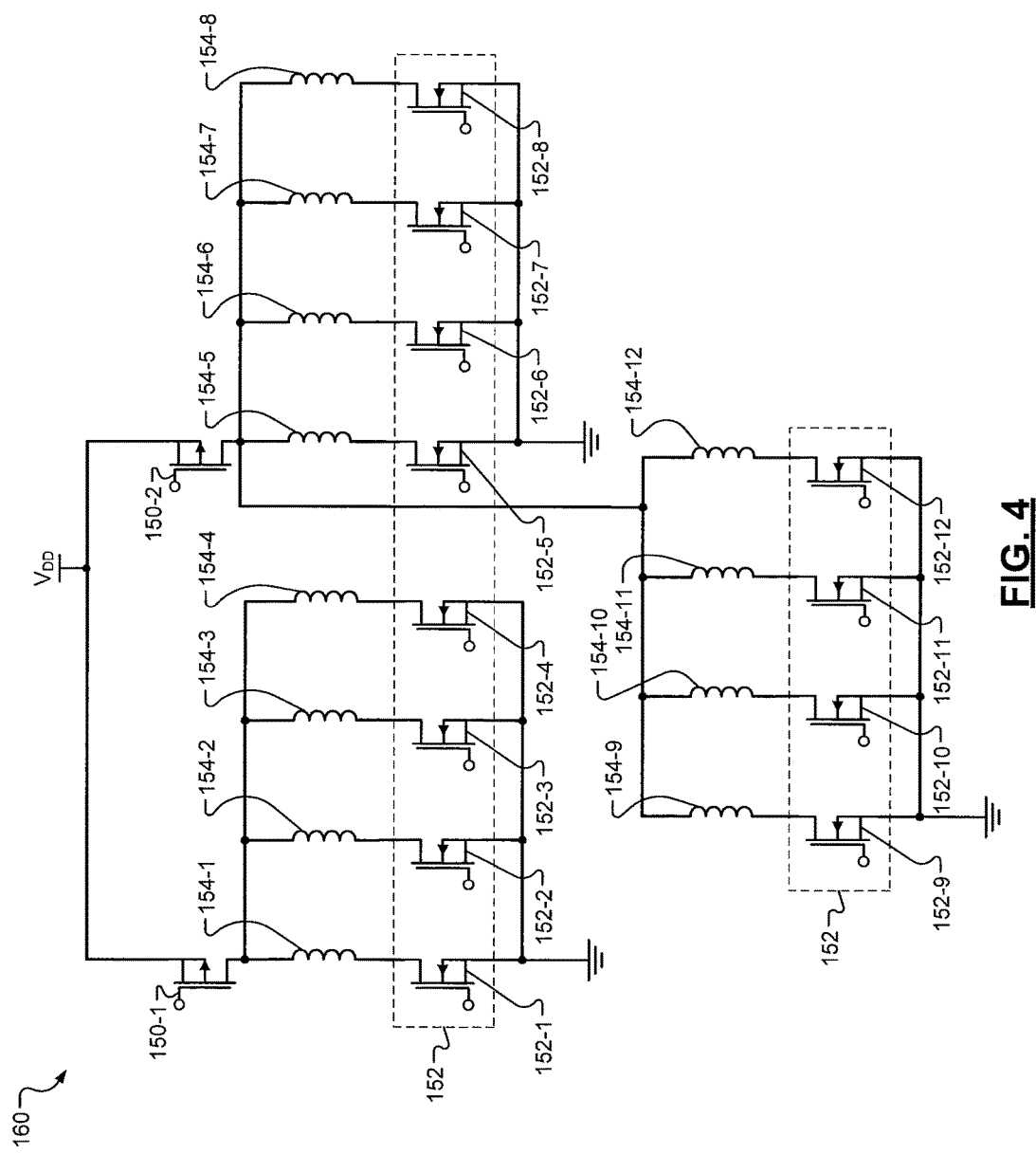
FIG. 4 is an example circuit diagram of an engine control module according to the present disclosure.

FIG. 4 is an example circuit diagram of an ECM 160. As shown in FIG. 4, the high side drivers 150-1, 150-2 are MOSFETs (e.g., P-channel MOSFETs). Sources of the first high side driver 150-1 and the second high side driver 150-2 are connected to a power supply $V_{DD}$. Gates of the first high side driver 150-1 and the second high side driver 150-2 are connected to a ground potential. A drain end of the first high side driver 150-1 is connected in parallel to a first end of a first plurality of intake coils 154-1, 154-2, 154-3, and 154-4. Respective second ends of the first plurality of intake coils 154-1, 154-2, 154-3, and 154-4 are connected to a drain end of a first plurality of low side drivers 152-1, 152-2, 152-3, and 152-4. The first plurality of low side drivers 152-1, 152-2, 152-3, and 152-4 are MOSFETs (e.g., N-Channel MOSFETs). Sources and gates of the first plurality of low side drivers 152-1, 152-2, 152-3, and 152-4 are connected to a ground potential. A drain end of the second high side driver 150-2 is connected in parallel to a first end of a second plurality of intake coils 154-5, 154-6, 154-7, and 154-8, and a first end of a plurality of exhaust coils 154-9, 154-10, 154-11, and 154-12. Respective second ends of the second plurality of intake coils 154-5, 154-6, 154-7, and 154-8 are connected to a drain end of a second plurality of low side drivers 152-5, 152-6, 152-7, and 152-8. The second plurality of low side drivers 152-5, 152-6, 152-7, and 152-8 are MOSFETs (e.g., N-Channel MOSFETs). Sources and gates of the second plurality of low side drivers 152-5, 152-6, 152-7, and 152-8 are connected to a ground potential. Respective second ends of the plurality of exhaust coils 154-9, 154-10, 154-11, and 154-12 are connected to a drain end of a third plurality of low side drivers 152-9, 152-10, 152-11, and 152-12. The third plurality of low side drivers 152-9, 152-10, 152-11, and 152-12 are MOSFETs (e.g., N-Channel MOSFETs). Sources and gates of the third plurality of low side drivers 152-9, 152-10, 152-11, and 152-12 are connected to a ground potential.

The intake coil 154-1 and the low side driver 152-1 command the operation of the intake camshaft 126 for the first cylinder 114-1 and the second cylinder 114-2 between the high lobe 138 and the low lobe 140 lift states. The intake coil 154-2 and the low side driver 152-2 command the operation of the intake camshaft 126 for the first cylinder 114-1 and the second cylinder 114-2 between the low lobe 140 and the deactivation lobe 142 lift states. The joint operation of commanding the first cylinder 114-1 and the second cylinder 114-2 between the higher lift state and the lower lift state is collectively referred to as the first intake actuator 134-1.

The intake coil 154-3 and the low side driver 152-3 command the operation of the intake camshaft 126 for the third cylinder 114-3 and the fourth cylinder 114-4 between the high lobe 138 and the low lobe 140 lift states. The intake coil 154-4 and the low side driver 152-4 command the operation of the intake camshaft 126 for the third cylinder 114-3 and the fourth cylinder 114-4 between the low lobe 140 and the deactivation lobe 142 lift states. The joint operation of commanding the third cylinder 114-3 and fourth cylinder 114-4 between the higher lift state and the lower lift state is collectively referred to as the third intake actuator 134-3.

The intake coil 154-5 and the low side driver 152-5 command the operation of the intake camshaft 126 for the third cylinder 114-3 and the fourth cylinder 114-4 between the deactivation lobe 142 and the low lobe 140 lift states. The intake coil 154-7 and the low side driver 152-7 command the operation of the intake camshaft 126 for the third cylinder 114-3 and fourth cylinder 114-4 between the low lobe 140 and the high lobe 138 lift states. The joint operation of commanding the third cylinder 114-3 and the fourth cylinder 114-4 between the lower lift state and the higher lift state is collectively referred to as the fourth intake actuator 134-4.

The intake coil 154-6 and the low side driver 152-6 command the operation of the intake camshaft 126 for the first cylinder 114-1 and the second cylinder 114-2 between the low lobe 140 and the high lobe 138 lift states. The intake coil 154-8 and the low side driver 152-8 command the operation of the intake camshaft 126 for the first cylinder 114-1 and the second cylinder 114-2 between the deactivation lobe 142 and the low lobe 140 lift states. The joint operation of commanding the first cylinder 114-1 and the second cylinder 114-2 between the lower lift state and the higher lift state is collectively referred to as the second intake actuator 134-2.

The exhaust coil 154-9 and the low side driver 152-9 command the operation of the exhaust camshaft 132 for the second cylinder 114-2 between the high lobe 138 and the deactivation lobe 142 lift states. The exhaust coil 154-11 and the low side driver 152-11 command the operation of the exhaust camshaft 132 for the third cylinder 114-3 between the high lobe 138 and the deactivation lobe 142 lift states. The joint operation of commanding the second cylinder 114-2 and the third cylinder 114-3 between the higher lift state and the lower lift state is collectively referred to as the first exhaust actuator 136-1.

The exhaust coil 154-10 and the low side driver 152-10 command the operation of the exhaust camshaft 132 for the second cylinder 114-2 between the deactivation lobe 142 and the high lobe 138 lift states. The exhaust coil 154-12 and the low side driver 152-12 command the operation of the exhaust camshaft 132 for the third cylinder 114-3 between the deactivation lobe 142 and the high lobe 138 lift states. The joint operation of commanding the second cylinder 114-2 and the third cylinder 114-3 between the lower lift state and the higher lift state is collectively referred to as the second exhaust actuator 136-2.

Figure 5:
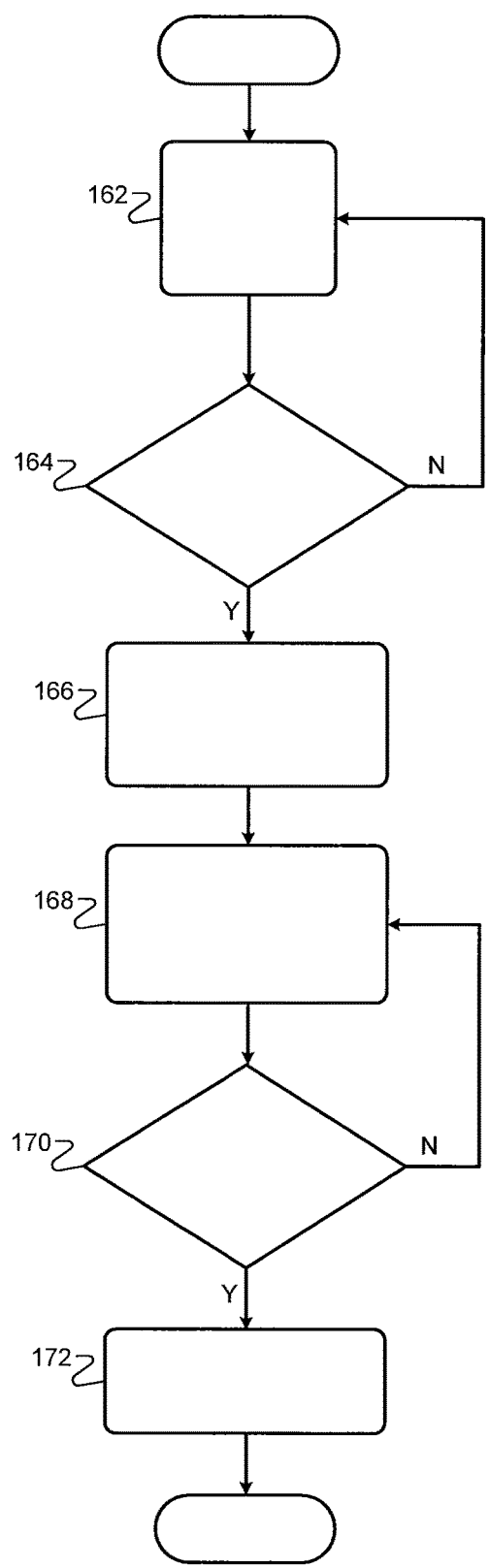
FIG. 5 is a flowchart depicting an example method for operating a camshaft actuator during a short to ground condition on any one of the camshaft actuators according to the present disclosure.

Referring now to FIG. 5, a flowchart depicting an example method for operating a camshaft actuator during a short to ground condition on any one of the camshaft actuators. Control may begin with 162 where the SCCM 156 commands the high side drivers 150-1, 150-2 and the low side drivers 152 to an on state. At 164, the ECM 160 determines whether a short to ground condition is present on any one of the intake camshaft actuators 134 or the exhaust camshaft actuators 136. If not, the SCCM 156 may continue to power the high side drivers 150-1, 150-2 and the low side drivers 152. If a short to ground condition is detected on any one of the intake camshaft actuators 134 or the exhaust camshaft actuators 136, the ECM 160 may send a fault signal to the SCCM 156 at 166. The SCCM 156 may then command the respective high side driver 150-1 or 150-2 corresponding to the detected camshaft actuator fault condition to an off state. At 168, power may be maintained to the respective high side driver, which does not have the detected camshaft actuator fault condition. At 170, the ECM 160 may determine whether the desired lift state is achieved. If not, the SCCM 156 may continue to power the respective alternative high side driver, which does not have the camshaft actuator fault condition, until the desired lift state is achieved. Once the desired lift state is achieved at 172, power and command to the respective alternative high side driver may terminate. For purposes of discussion, only one control loop is illustrated, and multiple control loops may be performed at a predetermined rate.

For example only, if a short to ground fault condition is detected on intake coil 154-1 by the ECM 160, the SCCM 160 may command the high side driver 150-1 to an off state while maintaining power to the respective alternative high side driver 150-2. At 170, the ECM 160 determines if the desired lift state is achieved. If not, the SCCM 156 may continue to power the respective alternative high side driver 150-2 until the desired lift state is achieved. Once the desired lift state is achieved at 172, the SCCM 156 may turn off the power to the respective alternative high side driver 152-2, and command of the high side drivers 150-1, 150-2 may end. While command of the high side drivers 150-1, 150-2 is shown and discussed as ending, FIG. 5 may be illustrative of one control loop, and multiple control loops may be performed at a predetermined rate.

Although presented with respect to the a short to ground fault condition detected on an intake coil (e.g., the intake coil 154-1), the principles of the present disclosure as described in FIG. 5 may also be applied to a short to ground fault condition detected on an exhaust coil (e.g., the exhaust coil 154-9). For example, if a short to ground fault condition is detected on the exhaust coil 154-9 by the ECM 160, the SCCM 160 may command the high side driver 150-2 to an off state while maintaining power to the respective alternative high side driver 150-1. Accordingly, inadvertently transitioning to a cylinder deactivation mode is prevented and the desired lift state is maintained and/or achieved.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. An engine control module comprising:
   at least one high side driver coupled to at least one intake camshaft actuator and at least one exhaust camshaft actuator;
   a plurality of low side drivers coupled to the at least one intake camshaft actuator and the at least one exhaust camshaft actuator; and
   a sliding camshaft control module that selectively actuates the at least one high side driver and the plurality of low side drivers based on a status associated with the at least one intake camshaft actuator and/or the at least one exhaust camshaft actuator.

2. The engine control module of claim 1, wherein the at least one high side driver includes a first high side driver and a second high side driver.

3. The engine control module of claim 2, wherein the status indicates a fault with the at least one intake camshaft actuator and/or the at least one exhaust camshaft actuator.

4. The engine control module of claim 3, wherein the fault indicates a short to ground.

5. The engine control module of claim 3, wherein the fault is associated with the first high side driver, and wherein the sliding camshaft control module selectively commands the first high side driver to an off state while maintaining power to the second high side driver until a desired cam lift state is achieved.

6. The engine control module of claim 1, wherein the at least one intake camshaft actuator and the at least one exhaust camshaft actuator include respective solenoids.

7. The engine control module of claim 1, wherein the at least one high side driver is a P-channel MOSFET and the plurality of low side drivers are N-channel MOSFETs.

8. The engine control module of claim 7, wherein the P-channel MOSFET further comprises:
   a source terminal, a drain terminal, and a gate terminal, wherein the source terminal is connected to a power source, the drain terminal is connected to a first end of the at least one intake camshaft actuator and the at least one exhaust camshaft actuator, and the gate terminal is connected to a ground potential.

9. The engine control module of claim 8, wherein the N-channel MOSFETs further comprises:
   a source terminal, a drain terminal, and a gate terminal, wherein the source terminal is connected to a ground potential, the drain terminal is connected to a second end of the at least one intake camshaft actuator and the at least one exhaust camshaft actuator, and the gate terminal is connected to a ground potential.

10. A method, comprising:
    providing at least one high side driver coupled to at least one intake camshaft actuator and at least one exhaust camshaft actuator;
    providing a plurality of low side drivers coupled to the at least one intake camshaft actuator and the at least one exhaust camshaft actuator; and
    selectively actuates the at least one high side driver and/or the plurality of low side drivers based on a status associated with the at least one intake camshaft actuator and/or the at least one exhaust camshaft actuator.

11. The method of claim 10, wherein the at least one high side driver includes a first high side driver and a second high side driver.

12. The method of claim 11, further comprising determining the status, wherein the status indicates a fault with the at least one intake camshaft actuator and/or the at least one exhaust camshaft actuator.

13. The method of claim 12, wherein the fault indicates a short to ground.

14. The method of claim 12, wherein the fault is associated with the first high side driver, and further comprising selectively commanding the first high side driver to an off state while maintaining power to the second high side driver until a desired cam lift state is achieved.

15. The method of claim 10, wherein the at least one intake camshaft actuator and the at least one exhaust camshaft actuator include respective solenoids.

16. The method of claim 10, wherein the at least one high side driver is a P-channel MOSFET and the plurality of low side drivers are N-channel MOSFETs.

17. The method of claim 16, wherein the P-channel MOSFET further comprises:
    a source terminal, a drain terminal, and a gate terminal, wherein the source terminal is connected to a power source, the drain terminal is connected to a first end of the at least one intake camshaft actuator and the at least one exhaust camshaft actuator, and the gate terminal is connected to a ground potential.

18. The method of claim 17, wherein the N-channel MOSFETs further comprises:
    a source terminal, a drain terminal, and a gate terminal, wherein the source terminal is connected to a ground potential, the drain terminal is connected to a second end of the at least one intake camshaft actuator and the at least one exhaust camshaft actuator, and the gate terminal is connected to a ground potential.

\* \* \* \* \*